(12) United States Patent
Lukyanchuk et al.

(10) Patent No.: US 12,191,355 B2
(45) Date of Patent: Jan. 7, 2025

(54) FIELD EFFECT TRANSISTOR WITH A NEGATIVE CAPACITANCE GATE STRUCTURE

(71) Applicant: Terra Quantum AG, St. Gallen (CH)

(72) Inventors: Igor Lukyanchuk, St. Gallen (CH); Yurii Tikhonov, St. Gallen (CH); Anna Razumnaya, St. Gallen (CH); Valerii Vinokour, St. Gallen (CH)

(73) Assignee: TERRA QUANTUM AG, Rorschach (CH)

( * ) Notice: Subject to any disclaimer, the term of this patent is extended or adjusted under 35 U.S.C. 154(b) by 124 days.

(21) Appl. No.: 17/721,484

(22) Filed: Apr. 15, 2022

(65) Prior Publication Data

US 2022/0344471 A1    Oct. 27, 2022

(30) Foreign Application Priority Data

Apr. 15, 2021    (EP) .................................. 21168691

(51) Int. Cl.
*H01L 29/10*    (2006.01)
*H01L 29/06*    (2006.01)
(Continued)

(52) U.S. Cl.
CPC ...... *H01L 29/1029* (2013.01); *H01L 29/0649* (2013.01); *H01L 29/0847* (2013.01); *H01L 29/41* (2013.01)

(58) Field of Classification Search
CPC ............. H01L 29/1029; H01L 29/0649; H01L 29/0847; H01L 29/41; H01L 29/40111;
(Continued)

(56) References Cited

U.S. PATENT DOCUMENTS 10,332,874 B2 * 6/2019 Han ....................... H10B 53/30
2004/0036111 A1   2/2004 Nishikawa et al.
(Continued)

FOREIGN PATENT DOCUMENTS

KR   10-2020-0024067 A   3/2020

OTHER PUBLICATIONS

Dasgupta et al., "Modeling of Multi-domain Switching in Ferroelectric Materials: Application to Negative Capacitance FETs," IEEE, 2018 IEEE International Electron Devises Meeting (IEDM), pp. 9.2.1-9.2.4 (Dec. 2018).
(Continued)

*Primary Examiner* — Dao H Nguyen
(74) *Attorney, Agent, or Firm* — Leydig, Voit & Mayer, LTD (57) ABSTRACT

A field effect transistor has a negative capacitance gate structure. The field effect transistor comprises a channel and a gate dielectric arranged over the channel. The negative capacitance gate structure comprises a bottom electrode structure comprising a bottom electrode, a multi-domain structure, and a top electrode structure. The multi-domain structure comprises a multi-domain element arranged over the bottom electrode, the multi-domain element comprising a plurality of topological domains and at least one topological domain wall. The top electrode structure comprises a top electrode arranged over the multi-domain element. At least a section of the bottom electrode structure of the negative capacitance gate structure is arranged over the gate dielectric and adapted to be coupled to the channel through the gate dielectric.

14 Claims, 6 Drawing Sheets

(51) Int. Cl.
    *H01L 29/08*    (2006.01)
    *H01L 29/41*    (2006.01)

(58) Field of Classification Search
    CPC ............ H01L 29/78391; H01L 29/516; H01L 29/42364; H01L 29/42372; H01L 27/0629
    See application file for complete search history.

(56) References Cited

U.S. PATENT DOCUMENTS

| | | | |
|---|---|---|---|
| 2016/0365435 A1* | 12/2016 | Then | H01L 29/66462 |
| 2018/0166582 A1* | 6/2018 | Liao | H10B 51/30 |
| 2018/0277683 A1* | 9/2018 | Han | H01L 29/40111 |
| 2020/0066916 A1* | 2/2020 | Chen | B82Y 10/00 |
| 2020/0176456 A1 | 6/2020 | Dünkel et al. | |
| 2020/0282484 A1* | 9/2020 | Heo | B23K 3/08 |
| 2022/0189526 A1* | 6/2022 | Gong | G06N 3/084 |
| 2022/0189546 A1* | 6/2022 | Gong | G11C 11/2273 |

OTHER PUBLICATIONS

European Patent Office, Extended European Search Report in European Patent Application No. 21168691.0 (Oct. 6, 2021).
Gastaldi et al., "Transient Negative Capacitance of Silicon-doped HfO$_2$ in MFMIS and MFIS structures: experimental insights for hysteresis-free steep slope NC FETs," IEEE, 2019 IEEE International Electron Devises Meeting (IEDM), pp. 23.5.1-23.5.4 (Dec. 7, 2019).
Hattori et al., "Devise Simulation of Negative-Capacitance Field-Effect Transistors with a Ferroelectric Gate Insulator," IEEE, 2018 International Conference on Simulation of Semiconductor Processes and Devises (SISPAD), pp. 214-219 (Sep. 24, 2018).
Iniguez et al., "Ferroelectric negative capacitance," Nature Reviews Materials, 4(4): 243-256 (Apr. 2019).
Luk'yanchuk et al., "Harnessing Ferroelectric Domains for Negative Capacitance," arxiv.org, Cornell University Library, 201 Olin Library Cornell University, Ithaca, NY, 14853 (Nov. 29, 2018).
Korean Intellectual Property Office, Office Action in Korean Patent Application No. 10-2022-0046688, 18 pp. (Feb. 19, 2024).

* cited by examiner

FIELD EFFECT TRANSISTOR WITH A NEGATIVE CAPACITANCE GATE STRUCTURE

CROSS-REFERENCE TO RELATED APPLICATIONS

This patent application claims priority to European patent application ser. No. EP21168691.0, filed on Apr. 15, 2021, which is incorporated herein in its entirety by reference.

FIELD OF THE DISCLOSURE

The disclosure relates to a field-effect transistor, in particular to a gate structure of a field-effect transistor, and more specifically to a gate structure with a negative capacitance.

BACKGROUND OF THE INVENTION

The microelectronics industry is experiencing rapid growth with the trend towards miniaturization, yet with increasing complexity of the electronic circuits. The functional density (i.e., the number of interconnected devices per chip area) is increasing while the geometric size (i.e., the smallest component of circuit) that may be created using a state-of-art fabrication process is decreasing. The ever-increasing power density of integrated circuits may generate waste heat at a high density, threatening to limit the continued growth of integrated circuits in accordance with Moore's Law.

Transistors, and more specifically field-effect transistors, are basic circuit components in microelectronic technology. The ongoing miniaturization of the semiconductor circuitry faces challenges due to the power losses in field effect transistors and the resulting generated heat. For many years, significant efforts have been made to overcome the heating due to power dissipation, in an attempt to prevent the implementation of a more than 60-mV/decade subthreshold slope at room temperature.

Existing alternatives to standard metal-oxide-semiconductor field-effect transistors have been proposed and studied, including, in particular, tunnel field-effect transistors, nano electro-mechanical systems, and feedback field-effect transistors. Recently, the idea that the inclusion of ferroelectric materials may provide a negative capacitance has been put forth. In particular, negative capacitors could solve the problem of overcoming the 60-mV/decade subthreshold slope. Negative capacitance transistors may be created by incorporating a ferroelectric material into a gate. However, to this date, not a single material combination nor a single geometry have successfully been shown to realize capacitors with a stable, reversible and hysteresis-free negative capacitance.

General design principles for negative capacitance transistors are desirable for enabling a stable performance and for a flexible integration in semiconductor devices.

SUMMARY OF THE DISCLOSURE

In view of the technical problems described above, there is a need for an improved field effect transistor with a negative capacitance gate structure with a tuned negative capacitance, and in particular a need for a negative capacitance gate structure guaranteeing a stable static negative capacitance.

This objective is achieved with a field effect transistor according to independent claim 1. Independent claim 11 provides a method for operating a field effect transistor with a negative capacitance gate structure. The dependent claims relate to preferred embodiments.

In a first aspect, a field effect transistor has a negative capacitance gate structure. The field effect transistor comprises a channel and a gate dielectric arranged over the channel. The negative capacitance gate structure comprises a bottom electrode structure comprising a bottom electrode, a multi-domain structure, and a top electrode structure. The multi-domain structure comprises a multi-domain element arranged over the bottom electrode, the multi-domain element comprising a plurality of topological domains and at least one topological domain wall. The top electrode structure comprises a top electrode arranged over the multi-domain element. At least a section of the bottom electrode structure of the negative capacitance gate structure is arranged over the gate dielectric and adapted to be coupled to the channel through the gate dielectric.

The field-effect transistor with the negative capacitance gate structure may provide an enhanced switching speed. The field-effect transistor with the negative capacitance gate structure may also provide an improved energy efficiency. Consequently, the field-effect transistors with the negative capacitance gate structure may operate with the reduced energy dissipation and generate less waste heat, which may further improve the performance of the field-effect transistor. The field-effect transistor with the plurality of topological domains may provide a stable and reversible negative capacitance. The field-effect transistors with the plurality of topological domains may operate with reduced or even a negligible hysteresis of a voltage at the channel with respect to a voltage applied to the top electrode.

The topological domains may be ferroelectric polarization domains, and the topological domain wall may be a ferroelectric domain wall.

According to a corresponding embodiment, a field effect transistor has a negative capacitance gate structure. The field effect transistor comprises a channel and a gate dielectric arranged over the channel. The negative capacitance gate structure comprises a bottom electrode structure comprising a bottom electrode, a ferroelectric structure, and a top electrode structure. The ferroelectric structure comprises a ferroelectric element arranged over the bottom electrode, the ferroelectric element comprising a plurality of ferroelectric polarization domains and at least one ferroelectric domain wall. The top electrode structure comprises a top electrode arranged over the ferroelectric element. At least a section of the bottom electrode structure of the negative capacitance gate structure is arranged over the gate dielectric and adapted to be coupled to the channel through the gate dielectric.

Alternatively, the topological domains may be represented in terms of topological excitations, in particular topological solitons. The topological domain wall may be a topological excitation domain wall, in particular a topological soliton domain wall.

In particular, the topological domains may be polarization bubbles and the topological domain wall may be a polarization bubble domain wall; or the topological domains may be skyrmions and the topological domain wall may be a skyrmion domain wall; or the topological domains may be hopfions and the topological domain wall may be a hopfion domain wall.

According to an embodiment, an overall capacitance of the channel, the gate dielectric, and the negative capacitance gate structure is negative.

A top surface of the bottom electrode may be conformal with a bottom surface of the multi-domain element.

A top surface of the multi-domain element may be conformal with a bottom surface of the top electrode.

A bottom surface of the multi-domain element may be in direct contact with a top surface of the bottom electrode.

A top surface of the multi-domain element may be in direct contact with a bottom surface of the top electrode.

According to some embodiments, the field effect transistor further comprises a substrate, and the channel is arranged over the substrate.

According to some embodiments, the field effect transistor further comprises a first source-/drain-region and a second source-/drain-region, and the channel extends from the first source-/drain-region to the second source-/drain-region.

The first source-/drain-region and the second source-/drain-region may be arranged over the substrate.

The field effect may further comprise a fin structure, and the channel may be arranged on the fin structure.

The transistor may comprise or may be a flat transistor, a metal-insulator-semiconductor transistor, a metal-oxide-semiconductor transistor, in particular a dual-gate metal-oxide-semiconductor transistor or a triple-gate metal-oxide-semiconductor transistor, an insulated-gate bipolar transistor, a tunnel field-effect transistor, a metal-semiconductor field-effect transistor, a quantum field effect transistor, a Schottky-barrier field-effect transistor, and/or a fin-type field-effect transistor.

According to some embodiments, the negative capacitance gate structure has a stable static negative capacitance.

The multi-domain element may comprise a cross-sectional area with an orientation corresponding to an orientation of a top surface of the bottom electrode, and the cross-sectional area may define a shortest separation line to divide the cross sectional-area into a plurality of regions of equal area or essentially equal area.

In the context of the present disclosure, the shortest separation line may denote a shortest section line that divides the cross sectional area into a plurality of regions of (essentially) equal area, in particular into two regions of (essentially) equal area. The separation line may be shortest in the sense that no section line or segment line exists that divides the cross-sectional area into a plurality of regions of (essentially) equal area, and has a shorter intersection length with the cross-sectional area than the shortest separation line.

However, in some embodiments there may be several shortest separation lines of equal length, for instance when the cross sectional area is circular.

In the context of the present disclosure, the shortest separation line may correspond to or represent a topological domain wall separating adjacent topological domains, and/or the plurality of regions may correspond to or represent the plurality of topological domains.

The shortest separation line dividing the cross-sectional area into the plurality of regions of (essentially) equal area may correspond to an equilibrium position of the topological domain wall at a zero gate voltage. The shortest separation line may thus be referred to as an equilibrium separation line in the context of the present disclosure.

A reference line may be shifted with respect to the shortest separation line, and in particular may extend in parallel to the shortest separation line and at least partially in a surface defined by the cross-sectional area. A length of the reference line within the cross-sectional area may be shorter than a length of the shortest separation line within the cross-sectional area, and the length of the reference line within the cross-sectional area may differ from the length of the shortest separation line within the cross-sectional area by a difference which increases with increasing distance between the reference line and the shortest separation line in a vicinity of the shortest separation line. The shortest separation line may provide an image for the at least one topological domain wall. The difference between the length of the shortest separation line and the reference line may express an enhanced reliability and robustness of the negative capacitance.

Upon applying a gate voltage, the shortest separation line/equilibrium separation line may shift from its equilibrium position at zero voltage, and the reference line may correspond to or represent the shifted separation line. The separation line may decrease in length upon shifting from its equilibrium position at zero voltage, and may bend or curve to remain orthogonal to the edges of the cross-sectional area at the boundary of the cross-sectional area.

In some embodiments, the reference line is a segment of a straight line. In other embodiments, the reference line may comprise bended and curved sections.

The plurality of regions of essentially equal area may consist of exactly two regions of equal area.

This ensures the control over the dynamics of the at least one topological domain wall and embodiments with two topological polarization domains.

The top surface of the bottom electrode may be flat, and the cross-sectional area may be parallel to the top surface of the bottom electrode.

The top surface of the bottom electrode may comprise several flat surfaces, in particular flat surfaces reflecting surfaces of an underlying fin structure, and the cross-section area may be arranged in several planes, wherein each plane may be parallel to a flat surface of the bottom electrode.

The top surface of the bottom electrode may be cylindrical or spherical, and the cross-sectional area may be coaxial or concentric with the top surface of the bottom electrode.

The vicinity of the shortest separation line may comprise a region of the cross-sectional area closest to the shortest separation line, in particular a region of the cross-sectional area closest to the shortest separation line with an area of at least five percent of the area of the cross-sectional area, in particular with an area of at least ten percent of the area of the cross-sectional area, or with an area of at least 20 percent of the area of the cross-sectional area.

The field effect transistor may further comprise an additional dielectric element disposed between the bottom electrode structure and the top electrode structure, for example an additional dielectric element that constitutes a shell coating of the multi-domain element, in particular a shell coating of the ferroelectric element.

A material of the additional dielectric element may be different from a material of the multi-domain element.

At least a part, in particular at least a majority fraction of a material of the additional dielectric element may not be ferroelectric.

A first region between a first section of the bottom electrode structure and a first section of the top electrode structure may comprise material of the multi-domain element but not material of the additional dielectric element, and/or a second region between a second section of the bottom electrode structure and a second section of the top electrode structure may comprise material of the additional dielectric element but not material of the multi-domain element.

A first capacitor region may comprise or consist of the first section of the bottom electrode structure, the first region, and the first section of the top electrode structure, wherein the first capacitor region may have a negative capacitance.

According to some embodiments, a second capacitor region comprises or consists of the second section of the bottom electrode structure, the second region, and the second section of the top electrode structure, wherein the second capacitor region has a positive capacitance.

A space between the bottom electrode structure and the top electrode structure may comprise gas or vacuum spacers.

A space between the bottom electrode structure and the top electrode structure may partially or entirely be filled by the multi-domain structure and the additional dielectric element.

The multi-domain element may have a thickness along a first direction pointing from the bottom electrode to the top electrode, wherein a width of the multi-domain element at a position of the shortest separation line exceeds the thickness.

According to some embodiments, the width of the multi-domain element at the position of the shortest separation line does not exceed 1,000 nm, in particular does not exceed 100 nm, or does not exceed 50 nm, or does not exceed 20 nm, or does not exceed 15 nm.

A corresponding width of the multi-domain element advantageously promotes the formation of the topological domain wall, in particular the controlled formation of the topological domain wall at a position close to the shortest separation line.

According to some embodiments, the width of the multi-domain element at the position of the shortest separation line is at least 2 nm, in particular at least 5 nm, or at least 8 nm.

The plurality of topological domains may comprise exactly two topological domains.

Embodiments with exactly two topological domains may give a high level of control over the formation of the topological domain wall, in particular the controlled formation of the topological domain wall at a position close of the shortest separation line.

The at least one topological domain wall may comprise the shortest separation line when a difference between a surface potential of the bottom electrode and a surface potential of the top electrode is zero.

The difference between the surface potential of the bottom electrode and the surface potential of the top electrode may be a difference between a voltage of the bottom electrode and a voltage of the top electrode, corrected for a work function difference between a work function of the bottom electrode and a work function of the top electrode.

In embodiments in which the work function of the bottom electrode and the work function of the top electrode is identical, the difference between the surface potential of the bottom electrode and the surface potential of the top electrode may be the difference between the voltage of the bottom electrode and the voltage of the top electrode.

The field effect transistor may further comprise a second multi-domain element, wherein the additional dielectric element separates the multi-domain element and the second multi-domain element.

The second multi-domain element may have some or all of the features described above in the context of the multi-domain element.

The multi-domain element and the second multi-domain element may both be arranged above the bottom electrode.

The multi-domain element and the second multi-domain element may both be arranged below the top electrode.

In an embodiment, the multi-domain structure may comprise at least three multi-domain elements, and the additional dielectric structure may separate each of the at least three multi-domain elements from any other of the at least three multi-domain elements.

Each of the at least three multi-domain elements may be arranged between the bottom electrode and the top electrode.

In an embodiment, the additional dielectric element may fully or partially encircle the cross-sectional area.

The additional dielectric element may fully or partially encircle each multi-domain element comprised in the multi-domain structure.

The second multi-domain element may be disposed over a second gate dielectric.

In an embodiment, the channel of the field effect transistor may have a fin structure, and the gate dielectric and the second gate dielectric may be are arranged over different sides of the fin structure.

The gate dielectric and the second gate dielectric may form a continuous layer.

The field effect transistor may further comprise a second bottom electrode, and the second bottom electrode may be disposed over the second gate dielectric, and the second multi-domain element may be disposed over the second bottom electrode.

The bottom electrode and the second bottom electrode may be electrically connected to have a common electric potential.

The field effect transistor may comprise a second top electrode, and the second top electrode may be disposed over the second multi-domain element.

The top electrode and the second top electrode may be electrically connected to have a common electric potential.

The additional dielectric element may be arranged over a second bottom electrode, and the second bottom electrode may be different from the bottom electrode.

In particular, the section of the bottom electrode structure of the negative capacitance gate structure adapted to be coupled to the channel through the gate dielectric may comprise the bottom electrode or the second bottom electrode.

In corresponding embodiments, a first structure formed by the bottom electrode, the multi-domain element, and the top electrode may provide a negative capacitance, in particular a larger negative capacitance than a (positive) capacitance of a second structure formed by the second bottom electrode, the additional dielectric element, and the second top electrode.

The first structure may be formed on one part of a semiconductor substrate, and the second structure may be formed on a different part of the semiconductor substrate. Separating the first structure and the second structure may improve the flexibility of layout design and make a fabrication of a device comprising the field effect transistor more efficient, for example more cost-efficient, and/or easier and/or more reliable.

The section of the bottom electrode structure adapted to be coupled to the channel through the gate dielectric may comprise the bottom electrode, and the second bottom electrode may be arranged remotely from the channel.

The section of the bottom electrode structure adapted to be coupled to the channel through the gate dielectric may comprise the second bottom electrode, and the bottom electrode may be arranged remotely from the channel.

All bottom electrodes comprised in the bottom electrode structure may be electrically connected to each other, and/or all top electrodes comprised in the top electrode structure may be electrically connected to each other.

The electrical charge of the bottom electrode may be floating.

In particular, the bottom electrode may be partially or fully surrounded by insulating material.

In an embodiment, the field effect transistor may further comprise a charge control circuit electrically coupled to the bottom electrode, and the charge control circuit may be adapted to maintain a fixed charge of the bottom electrode.

In a second aspect, the disclosure relates to a method for operating a field effect transistor with a negative capacitance gate structure, wherein the field effect transistor comprises a channel and a gate dielectric arranged over the channel. The negative capacitance gate structure comprises a bottom electrode structure comprising a bottom electrode. A section of the bottom electrode structure is arranged over the gate dielectric. The negative capacitance gate structure further comprises a multi-domain structure and a top electrode structure. The multi-domain structure comprises a multi-domain element arranged over the bottom electrode, the multi-domain element comprising a plurality of topological domains and at least one topological domain wall. The top electrode structure comprises a top electrode arranged over the multi-domain element. The method comprises increasing a voltage of the top electrode by its modulus to reach a gate voltage, thereby changing a shape of the topological domain wall and causing an amplified voltage of the bottom electrode with a modulus larger than a modulus of the gate voltage.

According to an embodiment, the disclosure relates to a method for operating a field effect transistor with a negative capacitance gate structure, wherein the field effect transistor comprises a channel and a gate dielectric arranged over the channel. The negative capacitance gate structure comprises a bottom electrode structure comprising a bottom electrode. At least a section of the bottom electrode structure is arranged over the gate dielectric. The negative capacitance gate structure further comprises a ferroelectric structure and a top electrode structure. The ferroelectric structure comprises a ferroelectric element arranged over the bottom electrode, the ferroelectric element comprising a plurality of ferroelectric polarization domains and at least one ferroelectric domain wall. The top electrode structure comprises a top electrode arranged over the ferroelectric element. The method comprises increasing a voltage of the top electrode by its modulus to reach a gate voltage, thereby changing a shape of the ferroelectric domain wall and causing an amplified voltage of the bottom electrode with a modulus larger than a modulus of the gate voltage.

Alternatively, the topological domains may be represented in terms of topological excitations, in particular topological solitons. The topological domain wall may be a topological excitation domain wall, in particular a topological soliton domain wall.

In particular, the topological domains may be polarization bubbles and the topological domain wall may be a polarization bubble domain wall; or the topological domains may be skyrmions and the topological domain wall may be a skyrmion domain wall; or the topological domains may be hopfions and the topological domain wall may be a hopfion domain wall.

The method may further comprise keeping the charge on the bottom electrode constant while increasing the voltage of the top electrode by its modulus.

Changing the shape of the topological domain wall may comprise increasing a curvature of the topological domain wall.

Each bottom electrode comprised in the bottom electrode structure may have a same bottom electrode voltage, and/or each top electrode comprised in the top electrode structure may have a same top electrode voltage.

Increasing the voltage of the top electrode by its modulus may generate a corresponding voltage of the bottom electrode for each voltage of the top electrode applied.

The method may further comprise reducing the voltage of the top electrode by its modulus after having reached the gate voltage, in particular to generate the same corresponding voltage of the bottom electrode for each voltage of the top electrode applied as during increasing the voltage of the top electrode.

The corresponding voltage of the bottom electrode for each voltage of the top electrode applied may correspond to a net polarization of the multi-domain element.

In an embodiment, increasing the voltage of the top electrode to a reference value below the gate voltage may generate the same net polarization of the multi-domain element as reducing the voltage of the top electrode to the reference value.

The method may be characterized by features corresponding to some or all of the features described above in the context of the field effect transistor.

With particular reference to causing an amplified voltage of the bottom electrode, the amplification effect can be significantly enhanced by means of the additional dielectric element, such as a shell coating, which may tune the total gate capacity to negative but small by its modulus total gate capacitance.

DETAILED DESCRIPTION OF THE INVENTION

The following disclosure provides many different embodiments or examples for implementing an electric circuit with the field-effect transistor having a negative-capacitance gate structure to yield improved versatility. Consequently, the present disclosure may widen a capacitance matching window of the field effect transistor. In particular, the present disclosure may implement a negative-capacitance gate structure guaranteeing a reversible, stable static negative capacitance, as opposed to a nonlinear differential capacitance or a transient negative capacitance in the transient dynamical regime.

Specific examples of components and arrangements are described below to simplify the present disclosure. These are, of course, merely examples that are not limiting. For example, the formation of a first feature over or of a second feature may include embodiments in which the first and second features are formed in direct contact. These features may also include embodiments in which additional components may be formed between the first and second features, such that the first and second features may not be in direct contact.

Besides, the present disclosure may repeat reference numerals and letters in the various examples. This repetition is for simplicity and clarity and does not dictate a relationship between the various embodiments and configurations discussed.

Further, the disclosure description of an arrangement utilizing the "beneath," "below," "lower," "above," "upper," and the like terminology, may be used herein for ease of description to describe one element of the device in its spatial relationship to another element or aspect(s) or component(s) as illustrated in particular figures. The spatially relative terms may as well pertain to other different spatial settings of the possible device that may seemingly differ but be topologically equivalent to the configurations depicted in the figures. For example, the device may be oriented differently, and the spatially relative descriptors used herein may likewise be interpreted accordingly.

Likewise, a number or a range of numbers described as "about," "approximate," and the like, encompasses numbers that are within a reasonable range including the number described, such as within +/−10% or within +/−5% of the number described or other values as understood by a person skilled in the art. For example, the term "about 5 nm" encompasses the dimension range from 4.5 nm to 5.5 nm.

The various aspects of the present disclosure are now discussed in more detail below with reference to the figures.

Figure 1A:
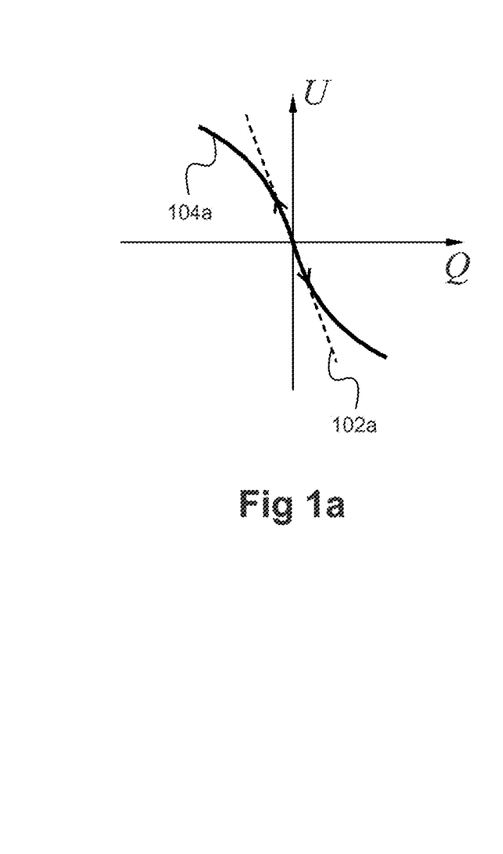
FIG. 1a is a schematic voltage-charge diagram that illustrates a reversible static type of negative capacitance.
Figures 1B, 1C:
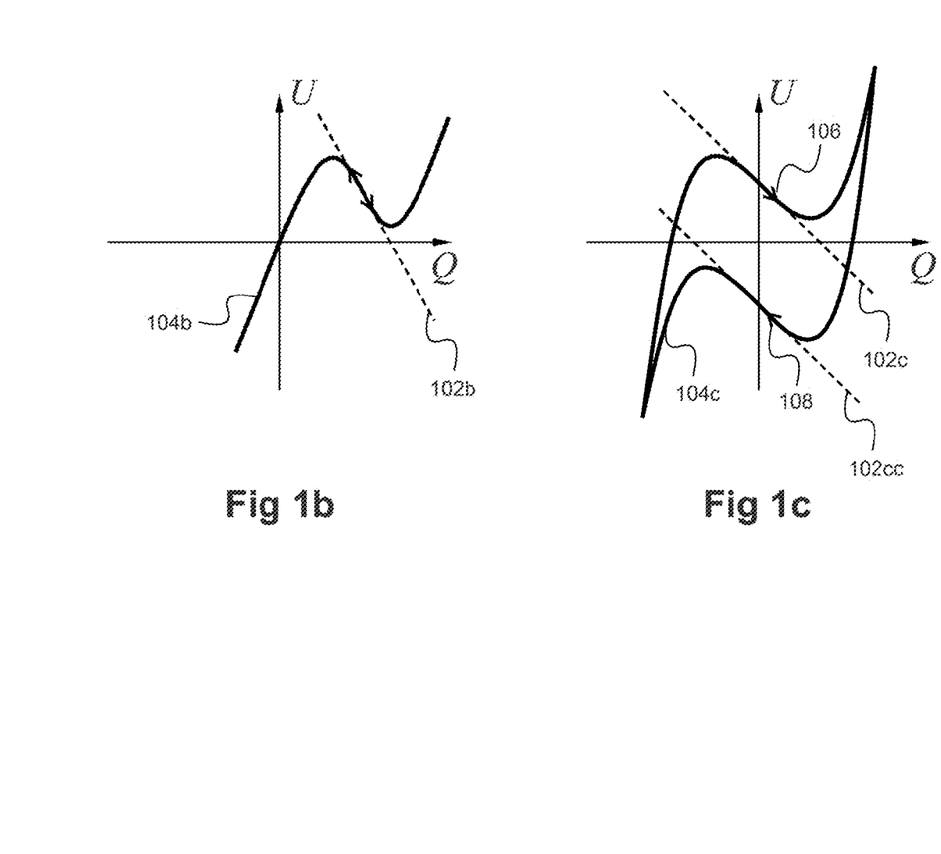
FIG. 1b is a schematic voltage-charge diagram that illustrates a reversible differential type of negative capacitance.
FIG. 1c is a schematic voltage-charge diagram that illustrates a irreversible transient type of negative capacitance.

FIG. 1a, FIG. 1b, and FIG. 1c depict voltage-charge characteristics for different types of negative capacitances.

In these figures, the horizontal axes correspond to a charge Q on a capacitor and the vertical axes to a voltage U applied to the capacitor in a charging process. The charging process may include, starting from a negative voltage with a given modulus (absolute value), changing the voltage to a positive voltage of the same modulus and back to the initial, negative voltage. Arrows on the voltage-current curves indicate the directions of the charging processes.

In FIG. 1a, the dashed line 102a depicts a direct proportionality with a negative slope between the voltage U and the charge Q. The direct proportionality is characteristic for a capacitor with a stable negative capacitance, and the negative slope defines the value of the stable static negative capacitance. The thick, solid curve 104a in FIG. 1a represents a voltage-current characteristic of a capacitator which exhibits a stable negative capacitance and has an approximately voltage-independent stable negative capacitance, at least for a sufficiently small voltage U applied.

In FIG. 1b, the thick solid line 104b depicts a nonlinear non-monotonic dependence of the voltage U upon the applied charge Q. The decreasing part of the curve, where the increasing charge leads to a decreasing of the capacitor's voltage defines the differential negative capacitance. The dashed line 102b is tangential to the voltage-current characteristic in the corresponding voltage U/charge Q range, with a slope depicting the value of the differential negative capacitance.

In FIG. 1c, the thick solid curve 104c displays an example of a dynamic hysteretic behaviour of the voltage U as a response to the change of the charge Q of the capacitor, demonstrating a dynamical transient negative capacitance. Such a dynamical transient negative capacitance may be realized during a transient, irreversible switching between equilibrium states. The equilibrium states may, for example, correspond to two different states of a topological domain. It is characteristic for the dynamical transient negative capacitance, that the tangential lines 102c and 102cc to the voltage-charge characteristics recorded while increasing the charge (arrow to the right 106) and decreasing the charge (arrow to the left 108) differ, i.e., the device with the voltage-charge characteristics 104c has a hysteresis.

In the state of the art, the term "negative capacitance" typically refers to the negative capacitance of a device with a single ferroelectric domain, see, e. g. KR 2014/0004855 A. Such a device may be expected to have a hysteretic voltage-charge characteristic similar to the curve 104c in FIG. 1c, with a dynamical transient negative capacitance. In contrast, the present disclosure provides a field-effect transistor with a negative-capacitance gate structure characterized by a stable static negative capacitance, as schematically indicated by the solid line 104a in FIG. 1a, with a weak or even negligible hysteresis. In some embodiments, the techniques of the present disclosure allow to achieve a complete reversibility and a complete absence of hysteresis. The field-effect transistor according to the present description may thus reduce the heat generated in the operation of the field-effect transistor. The field-effect transistor according to the description may thus have an improved energy efficiency. Moreover, in conventional field-effect transistors, the dissipation of this heat imposes severe restrictions on the miniaturization of technological electric circuits. The field-effect transistor according to the description may hence improve the miniaturization of semiconductor integrated circuitry comprising a field-effect transistor. In addition, the reduced overall capacitance of the field-effect transistor associated with the negative-capacitance gate structure according to the description may accelerate the switching of the channel of the field-effect transistor, and hence accelerate the switching speed of the field-effect transistor. The stable static negative capacitance may also provide a stable linear amplification of the gate voltage, which may be beneficial for overcoming the 60-mV/decade subthreshold slope limit of the subthreshold slope.

Figure 2A:
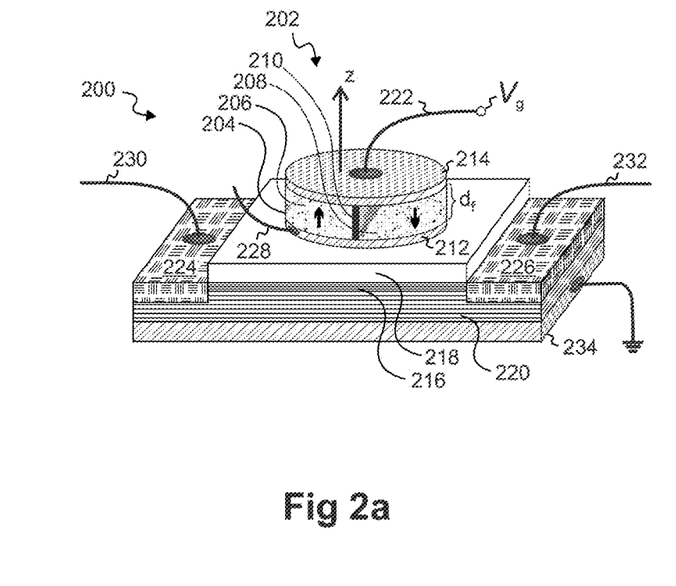
FIG. 2a shows a perspective view of an exemplary field-effect transistor with a negative capacitance gate structure.

FIG. 2a is a perspective view of an exemplary field-effect transistor 200 with a negative-capacitance gate structure 202. The negative-capacitance gate structure 202 comprises a multi-domain element 204 with a plurality of topological domains, which will in the context of some of the embodiments also be referred to as a domain structure or as a multi-domain polarization structure. A topological domain wall 210 separates topological domains 206, 208 of the domain structure. The topological domains may, for example, correspond to ferroelectric polarization domains, polarization bubbles, skyrmions or hopfions; which may be separated by a respective ferroelectric domain wall 210, a polarization bubble domain wall 210, a skyrmion domain wall 210, or a hopfion domain wall 210.

In the following, the field-effect transistor 200 with a negative-capacitance gate structure 202 will be described using chiefly the example of a multi-domain polarization texture (domain structure) comprising a first ferroelectric polarization domain 206 and a second ferroelectric polarization domain 208, which are separated by a ferroelectric domain wall 210. The first ferroelectric polarization domain 206 has a first orientation of its polarization, and the second ferroelectric polarization domain 208 has a second orientation of its polarization which is different from the first orientation. The ferroelectric domain wall 210 separates the first ferroelectric polarization domain 206 from the second ferroelectric polarization domain 208.

The ferroelectric element 204 is sandwiched between a bottom electrode 212 and a top electrode 214. The bottom electrode 212 is field-coupled or electromagnetically coupled to the channel 216 via the gate dielectric 218. One of the electrodes 212, 214, preferably the bottom electrode 212, comprises a material to promote the formation of the domain structure of the ferroelectric element 204 during its fabrication, and/or to stabilize the domain structure of the ferroelectric element 204 during the operation of the field-effect transistor 200. Alternatively, an additional material, e. g. a semiconducting or dielectric material, may be disposed on the bottom electrode 212 to promote the formation of the domain structure during fabrication, or to stabilize the domain structure.

In the example embodiment of FIG. 2a, the bottom electrode 212 and the top electrode 214 are both conformal with the ferroelectric element 204 at their interfaces with the ferroelectric element 204. In this example, the cross-sectional areas of the ferroelectric element 204, the bottom electrode 212 and the top electrode 214 do not change along a direction pointing from the bottom electrode 212 to the top electrode 214. More complex shapes, e. g. changing diameters or shapes of the elements 204, 212, 214 comprised in the negative-capacitance gate structure 202 along the direction z are feasible within the context of the present disclosure, as long as the size and shape of the ferroelectric element 204 is chosen to form the multi-domain polarization structure, for example, the two-domain polarization structure.

The ferroelectric element 204 may comprise or be manufactured from a variety of ferroelectric materials, including Pb(Zr,Ti)O3, PbTiO3, HfO2 (in particular doped HfO2, comprising, e. g., zirconium), BaTiO3, Ba(Sr,Ti)O3, P(VDF-TrFE). The ferroelectric element 204 may have a diameter (more generally a width at a position of a shortest separation line, which may correspond to an equilibrium separation line at zero applied voltage at the top electrode, cf. the description referring to FIG. 3a to FIG. 3c for details) in a range from 2 nm to 1,000 nm, with an exemplary diameter (width at a position of a shortest separation line) of about 10 nm. A thickness $d_f$ of the ferroelectric element may also fall in a range from 2 nm to 1,000 nm. The characteristic sizes of the ferroelectric element 204 providing a static stable negative capacitance may vary for different materials and span similar length intervals. The shape of the negative-capacitance gate structure 202 is chosen as a disc or as a cylinder. A cylinder-like shape may have advantages for achieving the desired stable reversible static negative capacitance value.

The top electrode 214 is connected to the external voltage source via the contact wire 222 to supply an input voltage $V_g$, which may be designated for the applied voltage tuning. The bottom electrode 212 may not only improve the formation and/or stabilization of the domain structure described above, but may also provide a homogeneous electrical potential at its bottom surface. The homogeneous electrical potential at the bottom surface of the bottom electrode 212 may in turn improve the homogeneity of the electrical potential at the gate dielectric 218 and ultimately at the channel at 216, thus improving the performance of the field-effect transistor. While the input voltage $V_g$ is changed to change the state of the field-effect transistor 200, e. g. the resistance of the channel 216 between a first source-/drain-region 224 and a second source-/drain-region 226, the bottom electrode 212 may be kept at a constant charge, for example, at a charge of zero. The optional contact wire 228 may be used to connect the bottom electrode 212 to an external source and may serve to regulate the charge at this electrode, if necessary, for example, to change it for moving the working point of the FET, or to maintain this charge constant, for example equal to zero.

The uncontrolled leakage of charge between the bottom electrode 212 and the channels 216 may be prevented by the gate dielectric 218. For example, the gate dielectric 218 may comprise a high-k dielectric, including SiO2, Al2O3, Li2O, HfSiO4, Sc2O3, SrO, ZrO2, Y2O3, BaO, Ta2O5, BaO, WO3, MoO3, TiO2, SrTiO3, DyScO3. The gate dielectric 218 may also comprise a low-k dielectric such as SiO2 or an organic dielectric.

The channel 216, the gate dielectric 218, the first source-/drain-region 224, and the second source-/drain-region 226, may each be formed on or in a substrate 220. For example, the substrate may be composed of a semiconductor, such as crystalline silicon. The first source-/drain-region 224 and the second source-/drain-region 226 may be highly doped. According to the example embodiment of FIG. 2a, the channel 216 has the same type of doping (n-type or p-type), and/or conductivity (predominantly by electrons or holes), respectively, as the source-/drain-regions 224, 226, which is different from a type of doping of the substrate 220. The source-/drain-regions 224, 226 may be connected to other electrical components, in particular other component of a semiconductor integrated circuit using the contact wires 230, 232. A back electrode 234, also referred to as a body electrode 234 may be present in some embodiments and used to apply a body voltage. In embodiments with a body electrode 234, the body voltage may serve as a reference for other electrical potentials, or voltages respectively, e. g. of the bottom electrode 212 and the top electrode 214. According to the embodiment of FIG. 2a, the body electrode 234 is grounded, but in alternative embodiments a different voltage may be applied to improve the performance of the field-effect transistor.

To manufacture the field-effect transistor 200 with a negative-capacitance gate structure 202, well-developed nano-manufacturing procedures, in particular nano-manufacturing procedures developed in the context of semiconductor industries, may be applied. These procedures allow to fabricate complex designs with precision and reliability. For example, advances in fabrications enable the creation of three-dimensional design of the field-effect transistor 200. An exemplary single crystal semiconducting substrate 200 of a selected type doping, or conductivity, respectively (for example, n-conductivity), is available commercially from various sources. Source and drain features 224, 226 may be formed by a proper doping of regions of or on the substrate 200, for instance by ion implantation or deposition of highly doped semiconductor material. A proper geometric design is achieved by the appropriate lithography and etching techniques, for example, electron beam lithography and ion etching. A gate dielectric layer 218 may be grown, for example, using an ALD technique. A bottom electrode 212 and a top electrode 214 may be created by the complex CVD and PVD methods and/or other suitable processes. A ferroelectric layer may be disposed, for example, over the bottom electrode 212 by, for example, an ALD approach and/or other suitable processes. A coating dielectric layer is optionally grown over the bottom electrode 212 by the, for example, ALD technique. The elements 212, 204, 214 of the negative-capacitance gate structure 202 may be structured individually or together after their deposition, e. g. in a single structuring step. In the former case, the geometric configuration at each stage is designed using appropriate lithography techniques, for example, extreme ultraviolet or electron beam lithography. Top conducting layers may be formed on or in the substrate to form gate, source and drain wire connection 222, 230, 232, for example by CVD and PVD methods. The patterning and architecture of the device is to be implemented by the, for example, Cadence Allegro software package and/or other suitable packages.

Figure 2B:
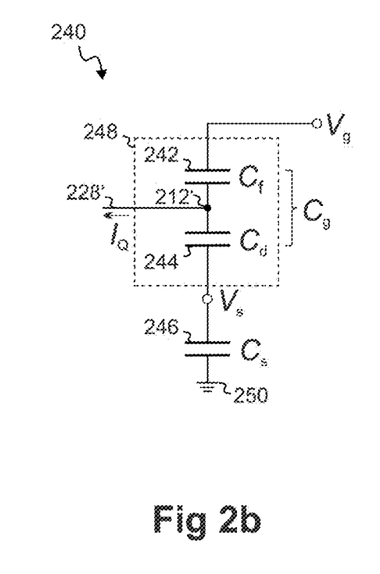
FIG. 2b shows an equivalent electric circuit of the field-effect transistor with a negative capacitance gate structure of FIG. 2a, FIG. 3a schematically illustrates a cross-sectional area of a multi-domain element according to an embodiment, FIG. 3b schematically illustrates a cross-sectional area of a multi-domain element according to another embodiment, FIG. 3c schematically illustrates a cross-sectional area of a multi-domain element according to another embodiment, FIG. 4a schematically illustrates a vertical cross-section of a field effect transistor with the negative capacitance gate structure according to an embodiment, with zero applied voltage, FIG. 4b schematically illustrates a vertical cross-sections of the field effect transistor with the negative capacitance gate structure according to the embodiment of FIG. 4a, but with a non-zero applied voltage, FIG. 4c schematically illustrates a horizontal cross-section of the field effect transistor of FIG. 4a, FIG. 4d schematically illustrates a horizontal cross-section of the field effect transistor of FIG. 4b, FIG. 5a schematically illustrates a perspective view of a field effect transistor with the negative capacitance gate structure according to a another embodiment.

FIG. 2b presents an effective electric circuit diagram 240 of an embodiment of a field-effect transistor 200 with a negative-capacitance gate structure 202 similar to the embodiment of FIG. 2a. A ferroelectric capacitor 242 with a ferroelectric capacitance $C_f$ of FIG. 2b may correspond to a structure similar to the negative-capacitance gate structure 202 of FIG. 2a comprising the bottom electrode 212, the ferroelectric element 204, at the top electrode 214. The gate voltage $V_g$ may correspond to a gate voltage $V_g$ applied to a top electrode 214 similar to the one of FIG. 2a. A dielectric capacitor 244 with a negative capacitance Ca may correspond to a structure similar to the one comprising the bottom electrode 212, the gate dielectric 218, and the channel 216 of FIG. 2a. The internal operating voltage $V_s$ may correspond to a voltage at the channel 216 of FIG. 2a. The capacitor 246 to the reference potential 250 with a capacitance $C_s$ may be one of a structure similar to the one of FIG. 2A comprising the channel 216 and the body electrode 234. The reference potential 250 may correspond to a reference potential of the substrate 220 of FIG. 2a, or to a potential of a body electrode 234 in embodiments comprising a body electrode 234. Alternative or in addition, the reference potential 250 may correspond to the potential of an internal depletion layer formed in a semiconductor substrate similar to the semiconductor substrate 220. In the example embodiment of FIG. 2b, the reference potential is grounded, but in alternative embodiments, different reference potentials may be applied. The current $I_q$ may correspond to a current flowing through a contact wire similar to the contact wire 228 of FIG. 2a.

The negative capacitance of the gate structure 202 with the ferroelectric element 204 results from a negative ferroelectric capacitance $C_f$ of the ferroelectric capacitor 242. The ferroelectric capacitor 242 is connected in series with the dielectric capacitor 244 which has a positive capacitance $C_d$, i. e., $C_d>0$. The total capacitance $C_g$ of a substructure 248 consisting of the ferroelectric capacitor 242 and the dielectric capacitor 244 is $C_g=1/(C_d^{-1}+C_f^{-1})$.

An optional intermediate contact 228', which may be similar to the contact wire 228 of FIG. 2a, transfers charge as a current $I_Q$ between an external source and a reference point 250 between $C_d$ and $C_f$. The reference point 212' may correspond to a point on the bottom electrode 212 of FIG. 2a. The current $I_Q$ serves to keep the charge on one of the electrodes of the ferroelectric capacitor 242 constant, and/or to keep the charge on one of the electrodes of the dielectric capacitor 244 constant. For example, the charge of the corresponding electrodes of the capacitors 242, 244 may be kept equal to zero.

A quantity commonly used to characterize the efficiency of a device comprising a field-effect transistor is the body factor $m=(\partial V_s/\partial V_g)^{-1}$. In the conventional field-effect transistors, $V_s<V_g$ and the body factor is larger than unity. In the embodiment of a field-effect transistor 200 with a negative-capacitance gate structure 202 corresponding to the circuit diagram 240 of FIG. 2b, the internal operating voltage $V_s$, which may correspond to a voltage at a channel 216, is related to the gate voltage $V_g$, which may correspond to a voltage applied to a top electrode 214, as $V_s=V_g/(1+C_s/C_g)=V_g/(1+C_s/C_d+C_s/C_f)$.

The negative sign of $C_f$ results in the possibility of reducing the resulting body factor $$m = \left(\frac{\partial V_s}{\partial V_g}\right)^{-1} = 1 + \frac{C_s}{C_d} + \frac{C_s}{C_f} \quad (1)$$

to values smaller than unity, provided that $|C_f|<C_d$ (i.e., $C_g<0$).

Integrating the negative-capacitance gate structure 202 with the ferroelectric element 204 into a gate stack, the field-effect transistor 200 of the description may therefore have a significantly decreased gate voltage $V_g$, while maintaining the same internal operating voltage $V_s$ in the region of the channel 216. This results in $V_s>V_g$ and a reduction of the body factor m, respectively, making the latter smaller than unity. This may improve the switching speed of the field-effect transistor 200. It may also improve the energy efficiency of the field-effect transistor 200, thereby reducing energy dissipation and heat production. The field-effect transistor 200 according to the description may therefore pose an important step towards exceeding the 60-mV/decade subthreshold slope at room temperature, which has been considered a restricting slope in conventional field-effect transistors.

Figure 3A:
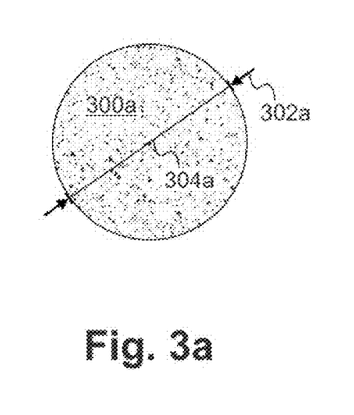
Figure 3B:
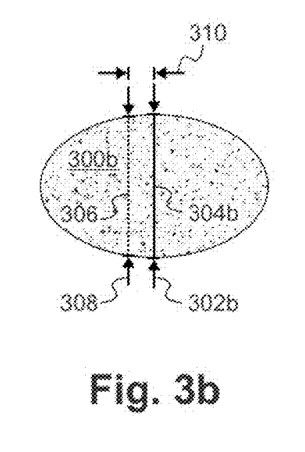
Figure 3C:
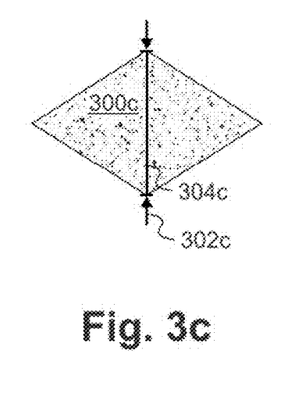

FIG. 3a to FIG. 3c show some examples of cross-sectional areas 300a, 300b, 300c of ferroelectric elements 204 which may be applied in negative capacitance gate structures 202. The negative capacitance of the negative capacitance gate structure 202 is closely related to the shape of a cross-sectional area of the ferroelectric element 204. According to the embodiment of FIG. 2a, the field-effect transistor 200 has a flat gate 216 and a cylindrical ferroelectric element 204. According to this embodiment, the cross-sectional area of the ferroelectric element 204 is a circle 300a as depicted in FIG. 3a, which may be defined by the intersection of a horizontal (perpendicular to the direction z) plane, i.e., a plane parallel to the bottom electrode 212, with the ferroelectric element 204 in a region between the bottom electrode 212 and the top electrode 214. However, more complicated shapes of the negative-capacitance gate structure 202 are likewise possible, for example, if the channel 216 is not flat and/or arranged on a section of a semiconductor substrate which is not flat. For example, in an embodiment in which the channel 216, the gate dielectric 218 and/or the negative capacitance gate structure 202 are curved, the cross section of the ferroelectric element 204 may refer to an intersection of a curved surface with the ferroelectric element 204, for example a curved surface which is co-axial or concentric with the curvature of the bottom electrode 212, the channel 216 and/or the gate dielectric 218.

Embodiments are likewise possible in which the channel 216 is disposed on or at least partially in two or three or more sides of a fin structure, in particular a semiconductor fin structure of a fin-type field-effect transistor. In such embodiments, the cross-sectional area of the ferroelectric element 204 may be defined by an intersection of the ferroelectric element 204 with a surface comprising two or three or more planes, wherein each of the planes is parallel to a side of the fin structure on that or in that the channel 216 is arranged. The cross-sectional area defined in this way may be curved or may comprise a plurality of flat regions. A cross-sectional area which is flat may be defined by a suitable projection of the cross-sectional area with the curvature of the several flat regions onto a single plane, e. g. by "tiling" the single plane with the several flat regions while maintaining at least some of their border lines.

For any cross-sectional area of any ferroelectric element 204, at least one shortest separation line may be defined as a section line of minimum width, i.e., as a section line that divides the cross-sectional area of the ferroelectric element 204 into two sub-areas of equal area and has the shortest intersection length with the cross-sectional area among all such section lines.

FIG. 3a to FIG. 3c illustrate an exemplary method to define a section line of a minimum width 302a, 302b, 302c for a few exemplary cross-sectional areas 300a, 300b, 300c. According to the embodiment, for any of the cross-sectional areas 300a, 300b, 300c, a shortest separation line is identified, which separates the cross-sectional area 300a, 300b, 300c into two regions of equal area. The choice of the shortest separation line does not need to be unique, and for example in FIG. 3a any line that comprises the center of the circular cross-sectional area 300a may be considered a shortest separation line in the context of the present disclosure. The minimum width is given by the section length 302a, 302b, 302c of the shortest separation line 304a, 304b, 304c within the cross-sectional area 300a, 300b, 300c.

This approach may be particularly useful for embodiments in which the plurality of ferroelectric polarization domains comprise exactly two ferroelectric polarization domains 206, 208. In embodiments in which the plurality of ferroelectric polarization domains comprises 3 (or 4, or any larger number of) ferroelectric polarization domains, a set of 2 (or 3, or any larger number of) shortest separation lines may be identified, which separate the cross-sectional area into 3 (or 4, or a larger number of) regions of equal area. The minimum width may then correspond to the length of the shortest separation line in the set of separation lines.

The cross-sectional areas 300a, 300b, 300c of FIG. 3a to FIG. 3f have in common, that their width changes in a vicinity (a neighbourhood) of the shortest separation line 304a, 304b, 304c. This shape may support the formation of a negative capacitance gate structure 202, as will be laid out in more detail in the context of FIG. 4a, FIG. 4b, FIG. 4c, and FIG. 4d. The changing width may be characterized using the reference line 306 depicted in FIG. 3b. The reference line 306 is parallel to the shortest separation line 304b and also located within the cross-sectional area 300b. For the sake of clarity, the reference line is shown only in the embodiment of FIG. 3b, but may similarly and in a straightforward way also be defined for the embodiments of FIG. 3a, FIG. 3c, or any other cross-sectional area and shortest separation line of any other ferroelectric element 202. The length 308 of the reference line 306 differs from the length 302b of the shortest separation line 304b by a difference which increases with increasing distance 310 between the reference line 308 and the shortest separation line 302b. This shape may be considered characteristic for the cross-sectional area of the ferroelectric element 204. It may also be sufficient if the length of the shortest separation line and of a reference line differ increasingly with distance for a reference line in a vicinity of the shortest separation line, but not for a further reference line outside of the vicinity of the shortest separation line.

The vicinity of the shortest separation line 304a, 304b, 304c provides a preferential formation site for the domain wall 210, which is advantageously made use of in the field-effect transistor 200 with the negative-capacitance gate structure 202 according to the present disclosure. This may distinguish the field-effect transistor 200 from conventional negative capacitance transistors, which use a different working principle based on a single domain structure without a domain wall, e. g. in KR 2014/0004855 A. Making use of both the domain wall 210 and the ferroelectric polarization of the ferroelectric polarization domains 206, 208, the field-effect transistor 200 according to the disclosure may advantageously have voltage-charge characteristics without a hysteresis, similar to the voltage-charge characteristics 104a of FIG. 1a, reflecting a stable, fully reversible negative capacitance. The multi-domain structure 206, 208 of the field-effect transistor 200 according to the description may be formed particularly efficiently for a minimum 302a, 302b, 302c width of the cross-sectional area 300a, 300b, 300c of the ferroelectric element 204 of a few nanometers up to a few tens of nanometers, for example for a minimum width 302a, 302b, 302c in the range from 2 to 20 nm. This makes the field-effect transistor 200 with the negative capacitance gate structure 202 particularly attractive for the integration in semiconductor devices and circuitry.

Figure 4A:
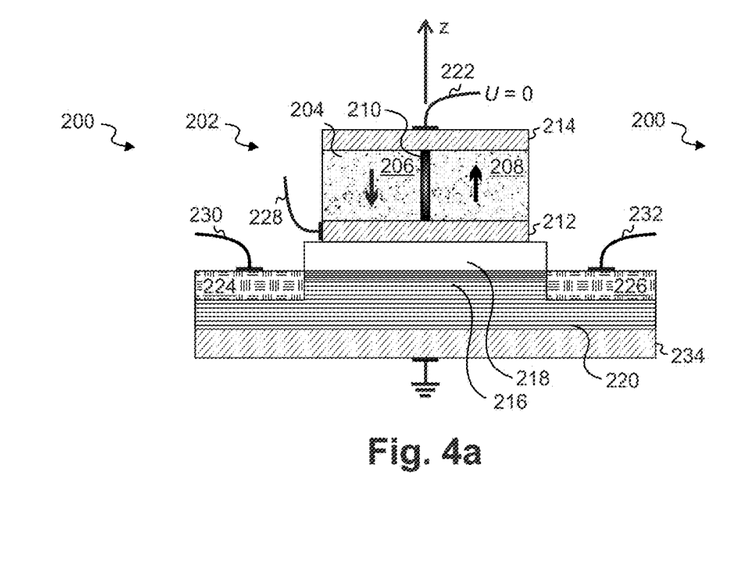
Figure 4B:
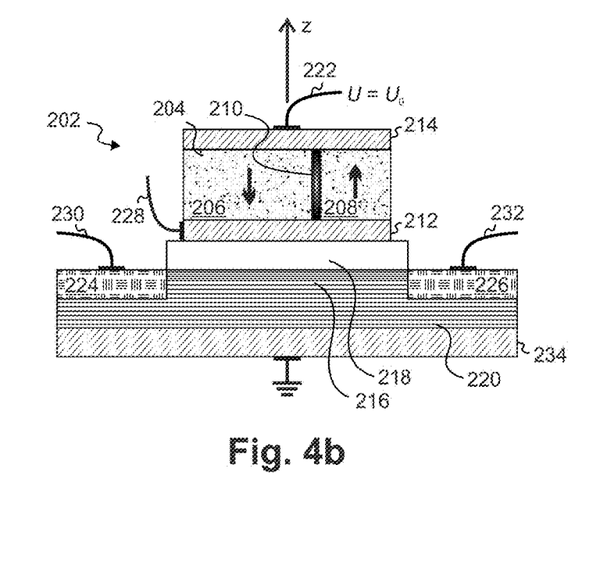
Figure 4C:
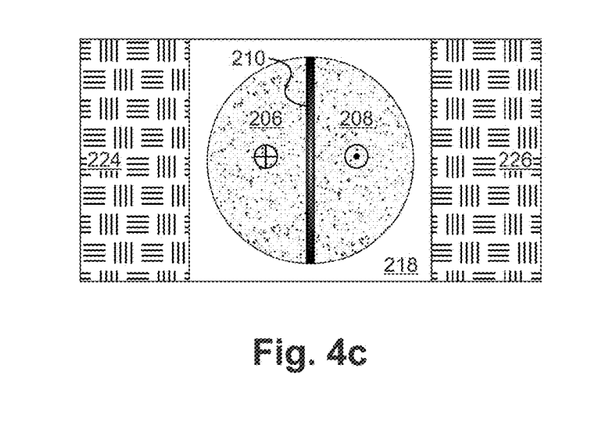
Figure 4D:
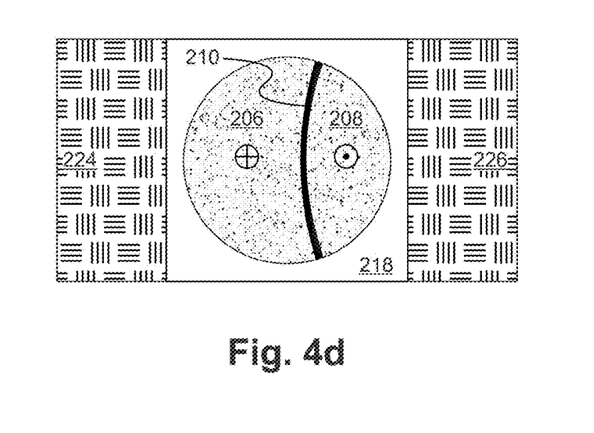

FIG. 4a to FIG. 4d illustrate the working mechanism of the exemplary field-effect transistor 200 giving rise to the negative capacitance of the negative capacitance gate structure 202. FIG. 4a and FIG. 4c display the vertical cross section of the field-effect transistor 200. FIG. 4c and FIG. 4d show horizontal cross sections of the field-effect transistor 200.

FIG. 4a and FIG. 4c show the field-effect transistor 200 with an equal surface potential of the bottom electrode 212 and the top electrode 214. The surface potential of the top electrode 214 may refer to the voltage of the top electrode 214 at its surface, which may correspond to the input voltage $V_g$ applied to the top electrode 214 corrected for a work function difference to a reference electrode. The surface potential of the bottom electrode 212 may be defined similarly. In the depicted embodiment, for the sake of clarity, the work functions of the top electrode 214 and the bottom electrode 212 are taken to be identical. The bottom electrode 212 has been grounded (with a voltage U=0 applied to the top electrode 214) and then isolated to have a floating potential. Hence, no surface potential difference is present between the top electrode 214 and the bottom electrode 212 when a voltage of U=0 is applied to the top electrode 214. In this situation, the domain wall 210 essentially comprises a shortest separation line. In the depicted embodiment with two polarization domains 206, 208 and a cylindrical ferroelectric element 204 with a circular cross-sectional area 300a, the domain wall 210 hence coincides with a plane along the z direction comprising the center of the ferroelectric element 204. While the electrodes 212, 214 are each neutral as a whole, the charges along the respective electrodes are distributed according to the polarization directions of the ferroelectric domains 206, 206, compensating the polarization of the polarization domains 206, 208 and thus reducing the electrostatic energy of the system. The minimum of the electrostatic energy of the system corresponds to a vanishing electric field inside the ferroelectric element 204.

FIG. 4b and FIG. 4d show the field-effect transistor 200 of FIG. 4a, FIG. 4c, with the difference that a voltage $+U_0$ has been applied to the top electrode 214. The domain wall 210 is displaced with respect to the position depicted in FIG. 4a, FIG. 4c to reduce the electrostatic energy of the system. Shape and position of the domain wall 210 are best visible in FIG. 4d. The domain wall is displaced from its original zero-field (U=0) bisectorial position to compensate the electric field caused by the extra charge on the top electrode 214. Importantly, the domain wall 210 may tend to minimize its surface energy. As a consequence, the shift towards the edge of the ferroelectric element 204 may exceed the shift required by the vanishing electric field inside the ferroelectric domains 206, 208. The domain wall 210 may bend in the vicinity of the edges of the ferroelectric element 204, and the curvature of the domain wall 210 may be increased as compared to the curvature of the domain wall 210 of FIG. 4a, FIG. 4c. The bending and the increased curvature of the domain wall 210 may give rise to an electric field of reversed direction inside the ferroelectric element 204 (as compared to a direction of an electric field between the top electrode 214 and the bottom electrode 212 that would be caused by applying the voltage $U=U_0$ if the ferroelectric element 204 was replaced by a conventional dielectric). In other words, in a region of the ferroelectric element 204 the electric field has a component pointing from the negatively charged electrode (e. g., the bottom electrode 212 in case of a positive $U_0$) to the positively charged electrode (e.g., the top electrode 214 in case of a positive $U_0$). In yet other words, in the regions of the ferroelectric element 204 with the reversed electric field direction, the bending and the increased curvature of the ferroelectric domain wall 210 may induce more net polarization than what is necessary to compensate the electric field due to electrode charges. The physical principles which may give rise to a negative capacitance of a ferroelectric with a two-domain texture are also described in further detail in Luk'yanchuk, I., Tikhonov, Y., Sené, A. & V. M. Vinokur. "Harnessing ferroelectric domains for negative capacitance", *Commun. Phys.* 2, 22 (2019).

Figure 5A:
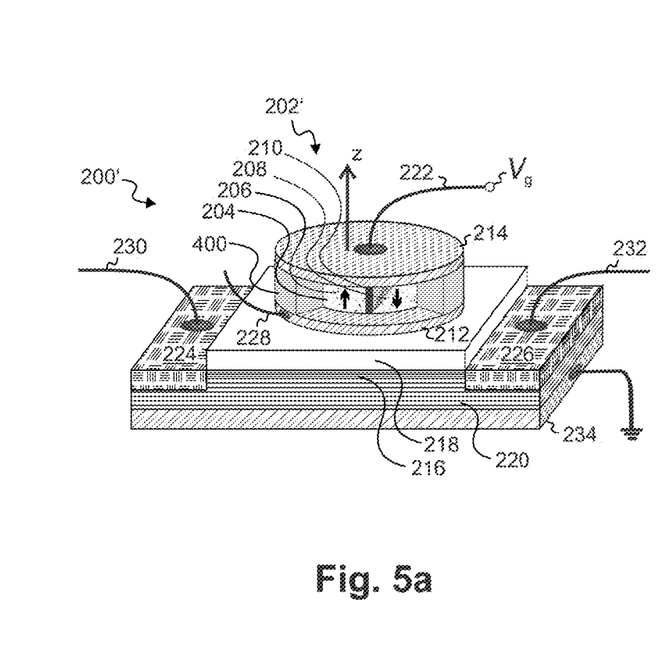
Figure 5B:
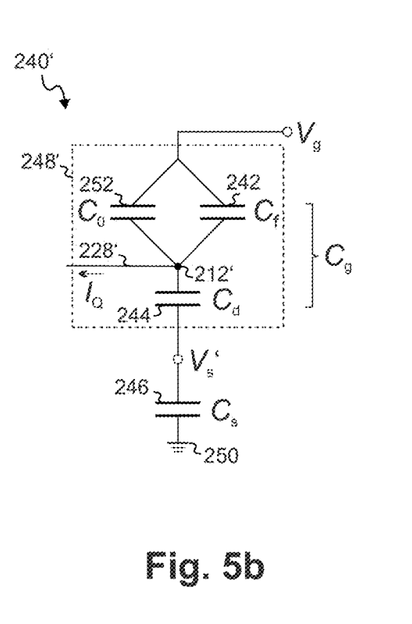
FIG. 5b shows an equivalent electric circuit of the field-effect transistor with a negative capacitance gate structure of FIG. 5a, FIG. 6a schematically illustrates a horizontal cross-section of a multi-domain structure and additional dielectric elements of a field effect transistor with the negative capacitance gate structure according to another embodiment, and FIG. 6b schematically illustrates a horizontal cross-section of a multi-domain structure and additional dielectric elements of a field effect transistor with the negative capacitance gate structure according to yet another embodiment.

FIG. 5a shows a field-effect transistor 200' with a negative capacitance gate structure 202' according to another embodiment. FIG. 5b gives the corresponding electric circuit diagram 240'.

The embodiment 200' of FIG. 5a is similar to the embodiment 200 of FIG. 2a, but further comprises an additional dielectric element 400 between the bottom electrode 212 and the top electrode 214. The section of the bottom electrode 212 and the top electrode 214 with the sandwiched additional dielectric element 400 forms an additional capacitor 252, which may contribute a positive capacitance $C_0$ parallel to the ferroelectric capacitor 242 comprising the bottom electrode 212, the top electrode 214, and the ferroelectric element 204. The total (negative) capacitance $C_f$ of the negative capacitance gate structure 202 is hence given by the sum of the capacitances $C_0$ and $C_f$ and may hence be adjusted by filling suitable volumes of the space between the bottom electrode 212 of the top electrode 214 with the ferroelectric element 204 or the dielectric element 400, respectively, to adjust $C_0$ and $C_f$. This allows to flexibly adjust the capacitance $C_g$ of the substructure 248', and hence the working regime of the field-effect transistor 200' with the negative capacitance gate structure 202' to the requirement of a given application. In particular, the negative capacitance of the field-effect transistor 200 according to the embodiment of FIG. 2a may be exceedingly large (by its modulus) for specific applications, and the introduction of the additional dielectric element 400 may improve the reduction of the body factor of a device comprising the field-effect transistor 200'.

Referring to the electric circuit diagram 240' of FIG. 5b, the total capacitance of the substructure 240' with the ferroelectric capacitor 242 with negative capacitance $C_f$, the additional capacitor 252 with a positive capacitance $C_0>0$, and the dielectric capacitor 244 with positive capacitance $C_d>0$, is $C_g=1/(C_d^{-1}+(C_f+C_0)^{-1})$. Properly choosing the dimensions of the additional dielectric element 400 tunes $C_0$ and, therefore, enables to achieve the desired negative value the capacitance $C_g$.

The internal operating voltage $V_s'$, which corresponds to a voltage at the channel 216 of the field-effect transistor 200' of FIG. 5, is related to the input voltage $V_g$ applied to the top electrode 214 as $V_s=V_g/(1+C_s/C_g)=V_g/(1+C_s/C_d+C_s/(C_f+C_0))$. The negative sign of $C_f$ results in the possibility of reducing the resulting body factor $$m = \left(\frac{\partial V_s}{\partial V_g}\right)^{-1} = 1 + \frac{C_s}{C_d} + \frac{C_s}{C_f + C_0} \quad (2)$$

to values smaller than unity, provided that $|C_f+C_0|<C_d$ (i.e., $C_g<0$). The disclosure thus provides an opportunity to reduce the body factor to magnitudes that are significantly smaller than unity, which may enhance the performance of a device comprising the field-effect transistor 200' with the negative-capacitance gate structure 202'.

According to the embodiment 200' of FIG. 5a, the ferroelectric element 204 is encircled by the additional dielectric element 400, and the field-effect transistor 200' may be referred to as a field effect transistor 200' with a coated capacitor. However, alternative designs of the negative capacitance gate structure 202' are possible, in which the additional dielectric element 400 may, for example, be located adjacent but specially separated from the ferroelectric element 204, or even be located remotely from the ferroelectric element 204, to improve the layout flexibility of the negative capacitance field-effect transistor 200'. In particular, in these designs the shape and/or location of the additional dielectric element 400 may be selected independently from the cross-sectional area of the ferroelectric element 204 and/or the shape of the ferroelectric element 204 and/or the location of the ferroelectric element 204.

Figure 6A:
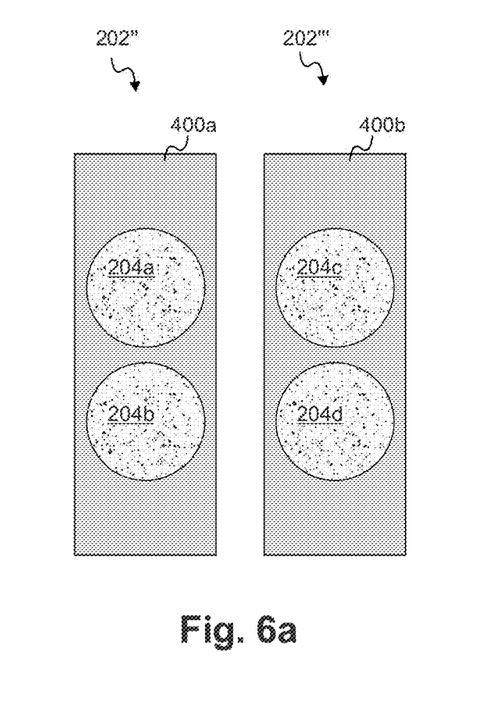
Figure 6B:
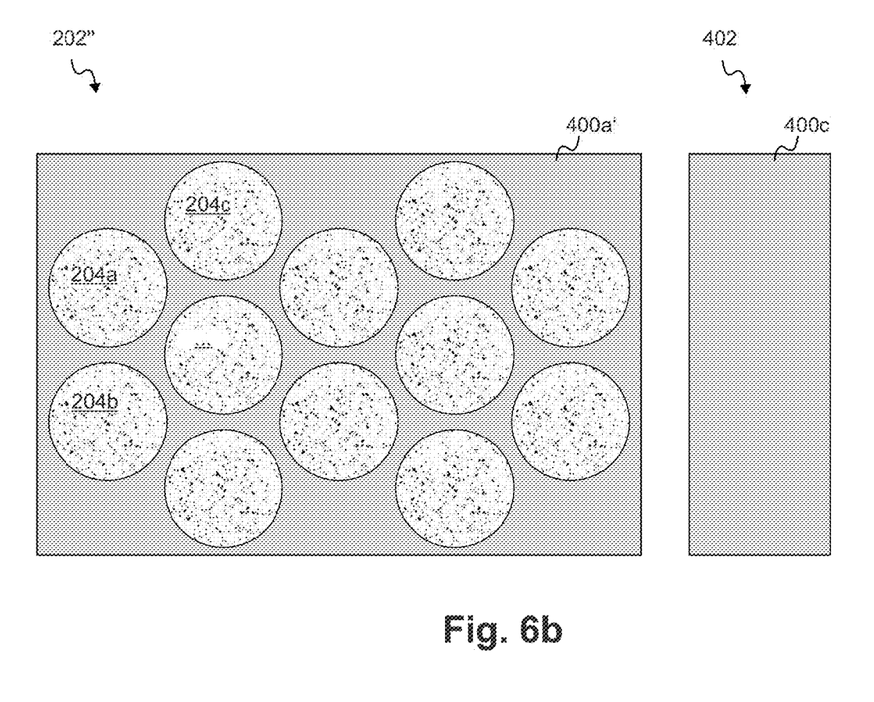

FIG. 6a and FIG. 6b show some other examples of negative capacitance gate structures 200", 200'" with feasible arrangements of ferroelectric elements 204a, 204b, 204c, 204d, . . . and at least one additional dielectric element 400a, 400a', 400b, 400c. According to the embodiments of FIG. 6a and FIG. 6b, the ferroelectric element 400a separates the ferroelectric elements 204a, 204b (and 204c in FIG. 6b). In this way, a laterally extended negative capacitance gate structure 202", 202'"" may be provided. Each of the negative capacitance gate structures 202", 202'" as well as the structure 402 may comprise a single bottom electrode and a single top electrode, or alternatively a plurality of bottom electrodes and/or top electrodes. The negative-capacitance gate structure may comprise a first negative capacitance gate structure 202" and a second negative capacitance gate structure 202'", and/or a first negative capacitance gate structure 202" and a structure 402 with a positive capacitance. Preferably, all top electrodes are to be kept at a same first potential, and all bottom electrodes are likewise to be kept at a same second potential. For example, top electrodes and bottom electrodes may be formed with shapes defined by the outermost contours of each of the additional dielectric elements 400a, 400a', 400b, 400c above and below the additional dielectric element 400a, 400a', 400b, 400c and the ferroelectric elements 204a, 204b, 204c, 204d, . . . . According to the embodiment of FIG. 6a, this results in a first negative capacitance gate structure 202" with the ferroelectric elements 204a, 204b and the additional dielectric element 400a sandwiched between a first bottom electrode and a second top electrode, and a second negative capacitance gate structure 202'" with the ferroelectric elements 204c, 204d and the additional dielectric structure 400b sandwiched between a second bottom electrode and a second top electrode. For example, the first negative capacitance gate structure 202" may be disposed on a first side of a fin structure of a field-effect transistor, and the second negative capacitance gate structure 202'" may be disposed on a second side of the fin structure of the same field-effect transistor.

FIG. 6b shows an alternative embodiment with a an extended additional dielectric structure 400a' and a plurality of ferroelectric elements 204a, 204b, 204c, . . . embedded therein. Sandwiching those between a first bottom electrode and a first top electrode, a first negative capacitance gate structure 202" is formed. Sandwiching the additional dielectric structure 400c between a second bottom electrode and a second top electrode results in the formation of a second layered structure 402. The first negative capacitance gate structure 202" may serve as a reservoir of negative capacitance, and the second layered structure 402 may be disposed over a channel and a gate dielectric of a field-effect transistor for gating the field-effect transistor with the negative-capacitance gate structure. Forming the first negative capacitance gate structure 202" remotely from the second layered structure 402 and disposing only the second bottom electrode on the gate dielectric and the channel may improve the layout flexibility of a semiconductor integrated circuit comprising the field-effect transistor with the negative capacitance gate structure.

The description and the figures merely serve to illustrate the techniques of the present disclosure and the advantages associated therewith, but should not be understood to imply any limitation. The scope of the present disclosure is to be determined from the appended claims.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A field effect transistor with a negative capacitance gate structure, the field effect transistor comprising a channel and a gate dielectric arranged over the channel, the negative capacitance gate structure comprising:
   a bottom electrode structure comprising a bottom electrode,
   a multi-domain structure comprising a multi-domain element arranged over the bottom electrode, the multi-domain element comprising a plurality of topological domains and at least one topological domain wall, and
   a top electrode structure comprising a top electrode arranged over the multi-domain element;
   wherein at least a section of the bottom electrode structure of the negative capacitance gate structure is arranged over the gate dielectric and adapted to be coupled to the channel through the gate dielectric, wherein the multi-domain element comprises:
a cross-sectional area with an orientation corresponding to an orientation of a top surface of the bottom electrode, the cross-sectional area defining a shortest separation line to divide the cross sectional-area into a plurality of regions of essentially equal area,
a reference line shifted with respect to the shortest separation line and in a surface defined by the cross-sectional area, and
wherein a length of the reference line within the cross-sectional area is shorter than a length of the shortest separation line within the cross-sectional area by a difference which increases with increasing distance between the reference line and the shortest separation line in a vicinity of the shortest separation line.

2. The field effect transistor according to claim 1, wherein the topological domains are ferroelectric domains and wherein the topological domain wall is a ferroelectric domain wall.

3. The field effect transistor according to claim 1, further comprising an additional dielectric element disposed between the bottom electrode structure and the top electrode structure.

4. The field effect transistor according to claim 3, further comprising a second multi-domain element, wherein the additional dielectric element separates the multi-domain element and the second multi-domain element.

5. The field effect transistor according to claim 3, wherein the additional dielectric element is arranged over a second bottom electrode, wherein the second bottom electrode is different from the bottom electrode, in particular, wherein the section of the bottom electrode structure of the negative capacitance gate structure adapted to be coupled to the channel through the gate dielectric comprises the bottom electrode or the second bottom electrode.

6. The field effect transistor according to claim 1, wherein the multi-domain element has a thickness along a first direction pointing from the bottom electrode to the top electrode, and wherein a width of the multi-domain element at a position of the shortest separation line exceeds the thickness.

7. The field effect transistor according to claim 1, wherein a width of the multi-domain element at the position of the shortest separation line does not exceed 1,000 nm, in particular does not exceed 100 nm, or does not exceed 50 nm, or does not exceed 20 nm, or does not exceed 15 nm.

8. The field effect transistor according to claim 1, wherein the plurality of topological domains comprises exactly two topological domains.

9. The field effect transistor according to claim 1, wherein the electrical charge of the bottom electrode is floating.

10. A method for operating a field effect transistor with a negative capacitance gate structure, wherein the field effect transistor comprises a channel and a gate dielectric arranged over the channel, wherein the negative capacitance gate structure comprises:
a bottom electrode structure comprising a bottom electrode, wherein at least a section of the bottom electrode structure is arranged over the gate dielectric,
a multi-domain structure comprising a multi-domain element arranged over the bottom electrode, the multi-domain element comprising a plurality of topological domains and at least one topological domain wall, and
a top electrode structure comprising a top electrode arranged over the multi- domain element,
wherein the multi-domain element comprises:
a cross-sectional area with an orientation corresponding to an orientation of a top surface of the bottom electrode, the cross-sectional area defining a shortest separation line to divide the cross sectional-area into a plurality of regions of essentially equal area,
a reference line shifted with respect to the shortest separation line and in a surface defined by the cross-sectional area, and
wherein a length of the reference line within the cross-sectional area is shorter than a length of the shortest separation line within the cross-sectional area by a difference which increases with increasing distance between the reference line and the shortest separation line in a vicinity of the shortest separation line;
the method comprising:
increasing a voltage of the top electrode by its modulus to reach a gate voltage, thereby changing a shape of the topological domain wall and causing an amplified voltage of the bottom electrode with a modulus larger than a modulus of the gate voltage.

11. The method according to claim 10, which further comprises keeping the charge on the bottom electrode constant while increasing the voltage of the top electrode by its modulus.

12. The method according to claim 10, wherein changing the shape of the topological domain wall comprises increasing a curvature of the topological domain wall.

13. The method according to claim 10, wherein each bottom electrode comprised in the bottom electrode structure has a same bottom electrode voltage, and/or wherein each top electrode comprised in the top electrode structure has a same top electrode voltage.

14. The method according to claim 10, wherein increasing the voltage of the top electrode by its modulus generates a corresponding voltage of the bottom electrode for each voltage of the top electrode applied, and the method further comprises reducing the voltage of the top electrode by its modulus after having reached the gate voltage, in particular to generate the same corresponding voltage of the bottom electrode for each voltage of the top electrode applied as during increasing the voltage of the top electrode.

* * * * *